United States Patent [19]

Blood

[11] Patent Number: 4,678,989
[45] Date of Patent: Jul. 7, 1987

[54] OPTICAL ABSORPTION SPECTROSCOPY FOR SEMICONDUCTORS

[75] Inventor: Peter Blood, Dorking, England

[73] Assignee: U.S. Philips Corporation, New York, N.Y.

[21] Appl. No.: 713,525

[22] Filed: Mar. 19, 1985

[30] Foreign Application Priority Data

Apr. 23, 1984 [GB] United Kingdom ............... 8407621

[51] Int. Cl.$^4$ ..................... G01R 31/26; G01R 15/12
[52] U.S. Cl. .......................... 324/158 D; 324/158 R; 324/73 R
[58] Field of Search .......... 324/158 D, 158 R, 158 T, 324/71.5; 250/492.2; 357/30, 456

[56] References Cited

U.S. PATENT DOCUMENTS

| | | | |
|---|---|---|---|
| 3,982,207 | 9/1976 | Dingle et al. | 357/4 SL |
| 4,333,051 | 6/1982 | Goodman | 324/158 R |
| 4,433,288 | 2/1984 | Moore | 324/158 D |
| 4,438,446 | 3/1984 | Tsang | 357/4 SL |

OTHER PUBLICATIONS

Sell et al, "Optical Absorption and Photoluminescence Studies of Thin GaAs Layers in GaAs-Al$_x$Ga$_{1-x}$ as Double Heterostructures", Journal of Applied Physics, vol. 45, No. 2, Feb. 1974, pp. 800–807.

Primary Examiner—Reinhard J. Eisenzopf
Assistant Examiner—Vinh P. Nguyen
Attorney, Agent, or Firm—Paul R. Miller

[57] ABSTRACT

Optical absorption data for a semiconductor sample is derived by providing a p-type layer (4) of the semiconductor sample between two larger band gap p-type cladding layers (3,5) on an n-type substrate (1). A p-type buffer layer (2) may be present on the substrate (1). Optical radiation is directed towards the p-n junction (6) between the substrate (1) and the buffer layer (2) through a transparent electrode (8) on the outer cladding layer (5). A further electrode (7) contacts the substrate (1) whereby an electric signal can be derived which is related to the voltage generated by the photovoltaic effect at the p-n junction. This signal is indicative of the absorption in the semiconductor sample (4) of the incident radiation in the wavelength range above the absorption edges of both cladding layers and below the wavelength limit at which the p-n junction is sensitive.

26 Claims, 4 Drawing Figures

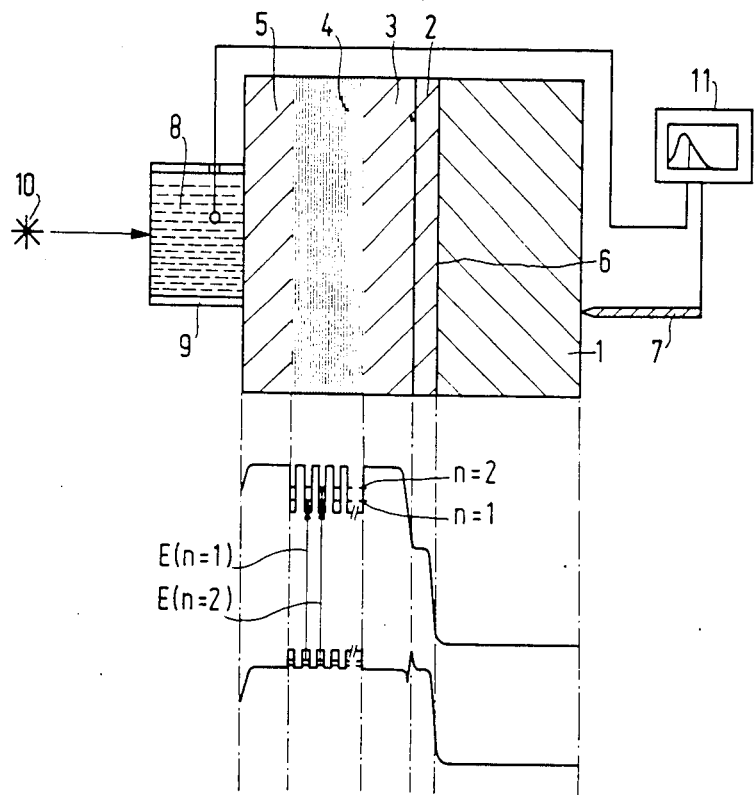
FIG.1
FIG.3
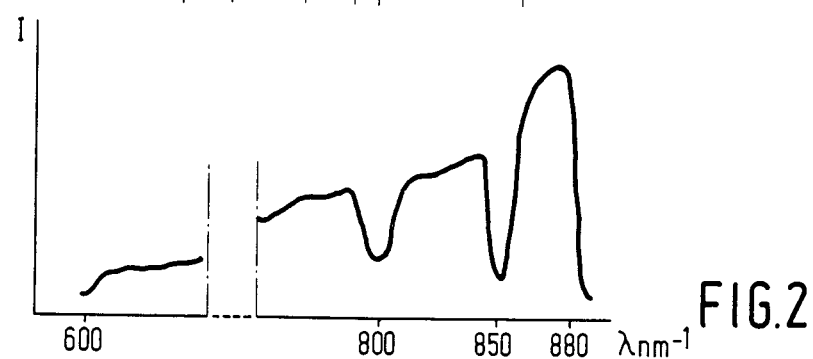
FIG.2
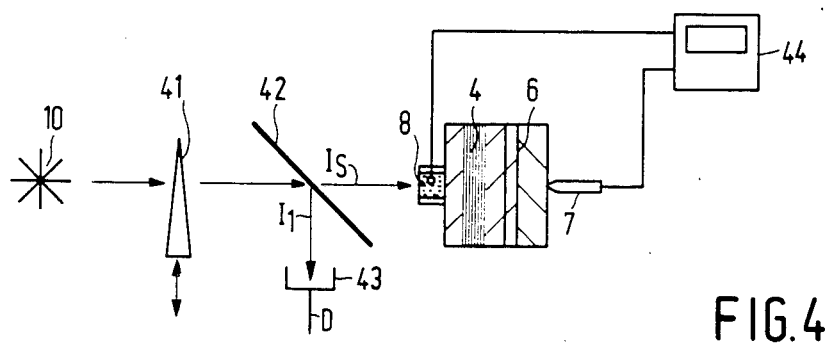
FIG.4

OPTICAL ABSORPTION SPECTROSCOPY FOR SEMICONDUCTORS

This invention relates to a method of spectroscopically analysing optical absorption in a semiconductor sample and further relates to apparatus for use in such a method.

Spectroscopic analysis can be used in the evaluation of semiconductor materials for deriving optical absorption data from which various characterising features, for example the relative position of energy levels, can be determined.

A method of spectroscopically analysing optical absorption in a semiconductor sample is described by D. D. Sell and H. C. Casey Jr. in Journal of Applied Physics, Vol. 45, No. 2, Feb. 1974, pages 800–807. The method described therein includes the steps of providing a layer of the semiconductor sample between two larger band gap semiconductor cladding layers on a substrate. A hole is etched through the substrate and optical radiation is directed via the hole toward the semiconductor sample through the inner cladding layer adjacent the substrate. Radiation which is not absorbed by the semiconductor sample passes through the outer cladding layer and is incident on an external photodetector which thus provides a signal indicative of the absorption in the semiconductor sample.

It is noted that radiation transmitted by the sample layer is actually incident on the photodetector. However, transmission and absorption are complementary parameters with one increasing as the other decreases and with the precise relationship between them depending also on interface reflections. Thus while the photodetector only directly senses the transmitted radiation, the signal derived therefrom is also indicative of the radiation absorbed by the semiconductor sample.

A drawback with the method described in the above journal reference is the requirement to form a hole in the substrate, which is a difficult step and can be very time consuming. For example, with a substrate which is 200 $\mu$m thick, it could take as long as half a day to provide a hole through the full thickness of the substrate using conventional polishing and chemical etching techniques.

According to a first aspect of the present invention there is provided a method of spectroscopically analysing optical absorption in a semiconductor sample including the steps of providing a layer of the semiconductor sample between two semiconductor cladding layers on a substrate, which cladding layers have a larger band gap than the semiconductor sample, and directing optical radiation toward the semiconductor sample through one of the cladding layers, characterised in that the semiconductor sample and the cladding layers are of one conductivity type and in that the substrate comprises a semiconductor material of the opposite conductivity type with a p-n junction being present between the substrate and the adjacent cladding layer, which p-n junction is sensitive to optical radiation at a wavelength above the absorption edges of both cladding layers, the method further including the steps of providing first electrode means on the substrate, providing on the outer cladding layer second electrode means transparent to the optical radiation, directing the optical radiation towards the semiconductor sample through the transparent second electrode means, and deriving from the first and second electrode means a signal related to the voltage generated across the p-n junction as a result of the photovoltaic effect with the signal being indicative of the absorption in the semiconductor sample of incident optical radiation in the wavelength range above the absorption edges of the cladding layers and below the wavelength limit at which the p-n junction is sensitive, wherein the outer cladding layer is sufficiently thick to prevent the depeletion layer associated with the junction between outer cladding layer and the second electrode means extending into the semiconductor sample layer, and the inner cladding layer adjacent the substrate is sufficiently thick to substantially confine charge carriers generated by absorption of the optical radiation in the semiconductor sample.

It is noted here that the term "absorption edge" as used herein refers to the wavelength value at which the absorption shows a sudden decrease in value.

Moreover, because of the complementary relationship between transmission and absorption discussed previously in the context of the prior art, it is also noted that the signal derived from the electrode means is indicative of the radiation absorbed by the semiconductor sample although it is the transmitted radiation which is actually sensed by the p-n junction.

A method of spectroscopically analysing optical absorption in a semiconductor sample in accordance with the invention has the advantage that, as compared with the known method mentioned previously, it dispenses with the difficult step of etching a hole in the substrate and in practice this can represent a significant time saving.

In order to optimise the quality of the cladding layers and the semiconductor sample which may be provided on the substrate by known semiconductor growth techniques, such as, for example, molecular beam epitaxy (MBE), it may be preferable to include a buffer layer between the substrate and the inner cladding layer.

The buffer layer may be of the same conductivity type as the semiconductor sample and the cladding layers, in which case the p-n junction is formed at the interface of the buffer layer and the substrate. Alternatively, the buffer layer may be of the same conductivity type as the substrate, in which case the p-n junction is formed at the interface of the buffer layer and the inner cladding layer. In both cases the buffer layer should have a narrower band gap than the semiconductor sample.

The method may be used for deriving the optical absorption data for a semiconductor sample in the form of a conventional semiconductor layer. However, it is equally suitable for deriving optical absorption data for a so-called superlattice structure where the sample comprises a periodic arrangement of very thin sub-layers of one semiconductor material interleaved with sub-layers of a different semiconductor material. In a superlattice structure the component layers are so thin that quantization occurs and new discrete energy levels (quantum levels) are created therein. In this case it is to be noted that the cladding layers are regarded as having a larger band gap than the superlattice sample when the band gap of the cladding layers is greater than the energy separation of the new quantum levels in the superlattice sample.

According to a further aspect of the invention there is provided apparatus for performing a method of spectroscopically analysing optical absorption in a semiconductor sample in accordance with the first aspect of the invention, wherein the semiconductor sample is provided as a layer of one conductivity type between two larger band gap semiconductor cladding layers of the same conductivity type on an opposite conductivity type semiconductor substrate, a p-n junction being present between the substrate and the adjacent cladding layer, characterised in that the apparatus comprises first electrode means for contacting the substrate, second electrode means transparent to optical radiation for contacting the outer cladding layer, a monochromatic optical radiation source for directing optical radiation towards the semiconductor sample through the transparent electrode means, and means for deriving from the first and second electrode means a signal related to the voltage generated across the p-n junction as a result of the photovoltaic effect with the signal being indicative of the absorption in the semiconductor sample of the incident optical radiation.

This apparatus has the advantage that it does not itself include a separate photodetector because the detector is, in effect, the p-n junction between the semiconductor substrate and the adjacent cladding layer.

In order to be able to characterise the semiconductor sample fully it is preferable for the radiation source to have means for varying in a substantially continuous manner the wavelength of the optical radiation emitted. The apparatus may also comprise means such as a graph plotter for recording the signal derived from the electrode means as a function of the wavelength of the incident optical radiation.

The apparatus may also include means for varying the intensity of optical radiation incident on the sample, means for measuring the intensity and means for recording a signal related to intensity.

The apparatus may further include means for varying the intensity of optical radiation incident on the sample in response to the signal related to the voltage generated across the p-n junction as a result of the photovoltaic effect.

The means for varying the intensity of optical radiation may be a variable attenuator, preferably a variable neutral density filter.

An embodiment of the invention will now be described by way of example with reference to the accompanying drawing in which:

FIG. 1 is a partial cross-section and a partial schematic view of apparatus for deriving optical absorption data for a semiconductor sample using a method in accordance with the invention, FIG. 2 is a graph showing the optical absorption characteristic of a semiconductor sample obtained using this method, FIG. 3 is an energy band diagram for the various semiconductor layers used in the method, and FIG. 4 is a partial cross section and a partial schematic view of a second apparatus for deriving optical absorption data for a semiconductor sample using a method in accordance with the invention.

It is noted that, for the sake of clarity and simplicity, the Figures are largely schematic and not to scale.

The following embodiment is concerned with deriving optical absorption data for a p-type semiconductor sample. As shown in FIG. 1, a layer 4 of the semiconductor sample is provided between two p-type semiconductor cladding layers 3,5 on an n-type semiconductor substrate 1. A p-type semiconductor buffer layer is also provided intermediate the substrate 1 and the adjacent cladding layer 3 forming a p-n junction 6 at the interface between the substrate 1 and the buffer layer 2. The provision of these various semiconductor layers is described in more detail below.

The starting material is an n-type gallium arsenide (GaAs) substrate 1 which is doped with an impurity concentration of $10^{18} cm^{-3}$. The substrate 1 may, for example, be 10 mm square and have a thickness of approximately 300 $\mu$m. A 0.2 $\mu$m thick buffer layer 2 of p-type GaAs is grown on the substrate 1 using molecular beam epitaxy (MBE). The buffer layer 2 is not intentionally doped but has an effective impurity concentration of $2 \times 10^{16} cm^{-3}$. The p-n junction 6 is thus formed at the interface between the substrate 1 and the buffer layer 2.

Next a 0.5 $\mu$m thick cladding layer 3 of p-type $Al_{0.5}Ga_{0.5}As$ is grown by MBE on the buffer layer 2. Cladding layer 3 is not intentionally doped but has an effective impurity concentration of approximately $2 \times 10^{16} cm^{-3}$. The semiconductor sample of interest is then provided as a p-type layer 4 on the cladding layer 3 and a further 0.5 $\mu$m thick cladding layer 5 of p-type $Al_{0.5}Ga_{0.5}As$ is grown by MBE on layer 4. Again, the layers 4 and 5 are not intentionally doped but have an effective impurity concentration of approximately $2 \times 10^{16} cm^{-3}$. In the present embodiment the semiconductor sample is a so-called 'superlattice' structure comprising a periodic arrangement of alternate $Al_{0.5}Ga_{0.5}As$ and GaAs sub-layers grown by MBE. MBE is known to produce atomically smooth layers and to allow very precise control over layer thicknesses. The overall thickness of the sample layer 4 is 3 $\mu$m comprising 100 periods. The $Al_{0.5}Ga_{0.5}As$ layers are approximately 200 angstroms thick and the GaAs layers are approximately 100 angstroms thick. The component layers of this superlattice structure are so thin, that quantization occurs and new discrete energy levels are created in the GaAs layers as described in more detail below with reference to FIG. 3. Incident photons can be absorbed by the sample layer 4 when the photon energy is greater than or equal to the energy associated with the absorption edge of the sample layer 4. Thus, by deriving optical absorption data for the superlattice layer 4 the energy of the absorbed photons can be established and hence it is possible to determine where the new energy levels occur.

Having grown the semiconductor layer configuration described above the method can proceed as follows.

Electrical contact is made to the substrate 1 by a metal probe 7 and to the outer cladding layer 5 by an electrolyte 8. The electrolyte, which may be sodium hydroxide for example, is contained in a cylindrical vessel 9 approximately 1 mm in diameter and centrally disposed on the cladding layer 5. The electrolyte 8 and the probe 7 are connected to a graph plotter 11 for recording the electric signal generated in the external circuitry. Although not shown in the drawing the apparatus suitably would further include means, such as a chopper, for modulating the incident radiation, and a synchronous detection facility to improve the signal to noise ratio.

Monochromatic optical radiation (represented by the arrow in FIG. 1) from a monochromator 10 is directed towards the semiconductor sample through the transparent electrolyte 8. The absorption edge of $Al_{0.5}Ga_{0.5}As$ occurs at approximately 600 nm. Thus for optical radiation having a wavelength greater than 600 nm the outer cladding layers 3 and 5 are transparent. Thus, unless the radiation is absorbed by the sample layer 4 it is transmitted to the GaAs buffer layer 2 adjacent the p-n junction 6. The absorption edge of GaAs occurs at approximately 880 nm so that shorter wavelength radiation reaching the buffer layer 2 produces electron-hole pairs in the depletion region around the p-n jucntion 6. A forward voltage is thus developed across the p-n junction 6 as a result of the photovoltaic effect. Consequently an electric signal is generated in the external circuit. Because of the complementary relationship between absorption and transmission, the electric signal thus derived is indicative of absorption in the semiconductor sample layer 4, although it is transmitted radiation which is actually sensed by the p-n junction 6. The electric signal is recorded on a graph plotter 11 as a function of the wavelength of the incident optical radiation. FIG. 2 shows the graph thus obtained or the superlattice sample described above. Optical absorption information is available in the wavelength range 600 to 880 nm as discussed previously. The troughs in the curve represent a high degree of absorption, i.e. a low level of transmission, in layer 4. With the superlattice structure described major absorption features have been found occuring at approximately 850 nm and 800 nm attributable to the quantum levels n=1 and n=2 respectively. This suggests that the energy separation of the n=1 quantum levels of the superlattice layer 4 is 1.46 eV and 1.55 eV for the n=2 quantum levels. This should be compared with the conventional band gap values of 1.42 eV for bulk GaAs and 2 eV for bulk $Al_{0.5}Ga_{0.5}As$.

FIG. 3 shows the energy band diagram for the semiconductor layer configuration described above. It is noted that the outer cladding layer 5 is sufficiently thick that band bending in the vicinity of the junction with the electrolyte 8 is confined to layer 5. In other words the depletion layer associated with that junction is prevented from exetnding through layer 5 to the sample layer 4. The sample layer 4 has a potential well associated with each of the thin GaAs component layers and the energy separation of the new quantum levels n=1 and n=2 is represented by the arrows labelled E(n=1) and E(n=2) respectively. The band gap of both the outer cladding layer 5 and the inner cladding layer 3 is greater than the energy separation of the new quantum levels in the sample layer 4. The inner clading layer 3 is sufficiently thick to confine charge carriers generated by absorption of the optical radiation in the potential well, that is to say in the semiconductor sample layer 4. Thus these photogenerated charge carriers cannot contribute to the voltage developed across the p-n junction 6.

The characteristic relationship between the open circuit potential difference generated across the p-n junction as a result of the photovoltaic effect and the intensity of the optical radiation generating that potential difference may not be linear. Also, the source of optical radiation from which the monochromatic illumination is derived by monochromator 10 of FIG. 1 cannot supply illumination at a constant intensity over the range of wavelengths required to fully characterise the sample. If no steps are taken to compensate for this, the signal related to the voltage generated across the p-n junction as a result of the photovoltaic effect will be a convolution of the desired information relating to the optical absorption of the sample, the varying intensity of illumination of the sample with wavelength and the non-linearity of the voltage vs intensity characteristic.

The apparatus shown in part cross-section and a part schematic view in FIG. 4 includes means for varying the intensity of the optical radiation incident on the sample.

In FIG. 4, monochromatic radiation from monochromator 10 is directed through a variable neutral density filter 41 and beam splitter 42 before entering the semiconductor sample 4 via the transparent electrolyte 8. The beam splitter directs a fixed fraction of the optical radiation transmitted by the neutral density filter to a photo-detector 43 which gives an output signal D proportional to the intensity of optical radiation $I_1$ incident upon it, from which the intensity $I_s$ of optical radiation incident upon the semiconductor sample may be calculated. The potential difference between the electrolyte 8 and the probe 7 is measured by potentiometer 44. To ensure that the p-n junction 6 with the semiconductor sample is at the same point on the voltage vs intensity characteristic at each wavelength at which a measurement is to be made, the neutral density filter is adjusted until the voltage attains a constant value which is the same for each wavelength. Then the intensity of the incident optical radiation is measured to give a value indicative of the optical absorption of the sample.

It will be evident in view of the exposition of the invention so far that various modifications may be made within the scope of the invention. For example the method can equally well be used for deriving optical absorption data for a conventional semiconductor layer rather than a superlattice structure. Also it may in some circumstances be permissible to dispense with the buffer layer which is provided primarily to improve the quality of the layers grown epitaxially thereon. In that case the p-n junction is formed at the interface between the substrate and the inner cladding layer. Alternatively, the buffer layer may be of the same conductivity type as the substrate in which case the p-n junction is formed at the interface of the inner cladding layer and the buffer layer. As another modification it is possible for the cladding layers to comprise different semiconductor materials with different band gaps. It is then possible to observe absorption features in the wavelength range above the absorption edges of both cladding layers and below the wavelength limit at which the p-n junction is sensitive. Finally, it is noted that the conductivity type of all the semiconductor materials may be of the opposite conductivity type. Thus it is possible to measure the optical absorption of an n-type semiconductor sample layer between two n-type cladding layers on a p-type substrate.

For a further example, the apparatus for performing the method may comprise a two-beam apparatus, the first beam being directed to a p-n junction behind semiconductor sample the second to a reference p-n junction produced by etching a semiconductor sample to reveal the inner cladding layer. Each beam is also directed through a variable neutral density filter and a beam splitter to direct a fixed part of the optical radiation to a photodetector similar to the single beam shown in FIG. 4. Operation of this apparatus in such a way as to equalise the open circuit potential differences of the p-n junctions by varying the variable neutral density filter in each beam allows the absorption coefficient at each wavelength to be calculated from the photodetector output signals.

Both the single and two beam apparatuses may conveniently be modified for automatic measurement under computer control by using a stepping motor and position feedback control for the monochromator and variable neutral density filters with the latter being controlled as part of a servo loop which is driven by the requirement to equalise the open circuit potential difference of the p-n junction behind the sample to a fixed value and in the two beam apparatus to make the open circuit potential difference of the p-n reference also equal the fixed value. The p-n junction potentials and the photodetector signals may be recovered by phase sensitive detection techniques, then analogue to digitally converted for analysis by the computer controlling the apparatus.

I claim:

1. A method for spectroscopically analyzing optical absorption in a semiconductor sample comprising the steps of forming a first cladding layer, a semiconductor sample layer, and a second outer cladding layer on a substrate, said first and second cladding layers having a larger band gap than said sample layer, wherein said sample layer and said first and second cladding layers are all of one conductivity type, and said substrate is of an opposite conductivity type, and wherein a p-n junction between said substrate and said first cladding layer is sensitive to optical radiation at a wavelength above absorption edges of said first and second cladding layers, forming a first electrode structure on said substrate, forming a second electrode structure on said second cladding layer, said second electrode structure being transparent to said optical radiation, directing said optical radiation toward said sample layer through said second cladding layer, and deriving a signal from said first and second electrode structures, said signal being related to a voltage generated across said p-n junction by a photovoltaic effect, and said signal being indicative of optical absorption in said sample layer of incident optical radiation in a wavelength range above said absorption edges of said first and second cladding layers and below a wavelength limit where said p-n junction is sensitive, wherein said second outer cladding layer has a sufficient thickness to prevent a depletion layer from extending into said semiconductor sample layer, said depletion layer being associated with a junction of said second cladding layer and said second electrode structure, and wherein said first cladding layer is sufficiently thick to substantially confine charge carriers generated by absorption of said optical radiation in said semiconductor sample layer.

2. A method according to claim 1, wherein a semiconductor buffer layer is formed between said first cladding layer and said substrate.

3. A method according to claim 2, wherein said buffer layer is of the same conductivity type as said semiconductor sample layer and said first and second cladding layers, said p-n junction being located between said buffer layer and said substrate.

4. A method according to claim 1, claim 2, or claim 3 wherein said first and second cladding layers are the same semiconductor material.

5. A method according to claim 1, claim 2, or claim 3, wherein said second electrode structure includes an electrolyte.

6. A method according to claim 1, claim 2, or claim 3, wherein said semiconductor sample layer includes a plurality of sub-layers of different semiconductor material.

7. A method according to claim 1, claim 2, or claim 3, further comprising the steps of varying wavelength of said optical radiation, and recording said signal as a function of said wavelength.

8. A method according to claim 1, claim 2, or claim 3, further comprising the steps of varying intensity of said optical radiation incident on said semiconductor sample layer, measuring said intensity, and recording a signal related to said intensity.

9. A method according to claim 8, wherein said step of varying intensity is carried out by a variable attenuator.

10. A method according to claim 1, claim 2, or claim 3 further comprising the step of varying intensity of said optical radiation incident on said semiconductor sample layer in response to said signal related to said voltage generated across said p-n junction by said photovoltaic effect.

11. A method according to claim 10, wherein said step of varying intensity is carried out by a variable attenuator.

12. A method according to claim 1, claim 2, or claim 3, further comprising the step of continuously varying wavelengths of emitted optical radiation.

13. An apparatus for spectroscopically analyzing optical absorption in a semiconductor sample comprising a substrate, a first cladding layer on said substrate, a semiconductor sample layer on said first cladding layer, and a second cladding layer on said sample layer, said first and second cladding layers having a larger band gap than said sample layer, wherein said sample layer and said first and second cladding layers are all of one conductivity type, and said substrate is of an opposite conductivity type, and wherein a p-n junction between said substrate and said first cladding layer is sensitive to optical radiation of a wavelength above absorption edges of said first and second cladding layers, first electrode means for contacting said substrate, second electrode means transparent to optical radiation for contacting said second cladding layer, radiation means for directing monochromatic optical radiation to said sample layer through said transparent second electrode means, and first means for deriving a signal from said first and second electrode means, said signal being related to a voltage generated across said p-n junction by a photovoltaic effect, and said signal indicating absorption in said semiconductor sample layer of said optical radiation.

14. An apparatus according to claim 13 wherein said second cladding layer has a sufficient thickness to prevent a depletion layer, associated with a junction of said second cladding layer and said second electrode means, from extending into said semiconductor sample layer, and wherein said first cladding layer is of sufficient thickness to substantially confine charge carriers in said semiconductor sample layer.

15. An apparatus according to claim 13, wherein a semiconductor buffer layer is formed between said first cladding layer and said substrate.

16. An apparatus according to claim 15, wherein said buffer layer is of said one conductivity type, said p-n junction being disposed between said buffer layer and said substrate.

17. An apparatus according to claim 13, claim 14, claim 15, or claim 16, wherein said first and second cladding layers are the same semiconductor material.

18. An apparatus according to claim 13, claim 14, claim 15, or claim 16, wherein said second electrode means includes an electrolytic cell.

19. An apparatus according to claim 13, claim 14, claim 15, or claim 16, wherein said semiconductor sample layer includes a plurality of sublayers of different semiconductor materials.

20. An apparatus according to claim 13, claim 14, claim 15, or claim 16, wherein second means are included for varying intensity of said optical radiation incident on said semiconductor sample layer in response to said signal related to a voltage across said p-n junction.

21. An apparatus according to claim 20, wherein said second means includes a variable attenuator.

22. An apparatus according to claim 21, wherein third means are included for recording said signal as a function of wavelength of said optical radiation.

23. An apparatus according to claim 20, wherein fourth means are included for measuring said intensity incident on said sample layer, and fifth means are included for providing a second signal related to said intensity.

24. An apparatus according to claim 13, claim 14, claim 15, or claim 16, wherein second means are included for continuously vaying wavelengths of emitted optical radiation.

25. An apparatus according to claim 24, wherein recording means are provided for recording said signal from said first means as a function of wavelengths of said optical radiation directed by said radiation means.

26. An apparatus according to claim 25, wherein said recording means includes a graph plotter.

* * * * *